United States Patent [19]

Bader

[11] Patent Number: 4,944,002
[45] Date of Patent: Jul. 24, 1990

[54] CURRENT SWITCH FOR USE IN TELEPHONY SYSTEMS OR THE LIKE

[75] Inventor: Scott K. Bader, Mesa, Ariz.

[73] Assignee: Motorola, Inc., Schaumburg, Ill.

[21] Appl. No.: 348,459

[22] Filed: May 8, 1989

[51] Int. Cl.⁵ .............................................. H04M 9/08
[52] U.S. Cl. ................................. 379/388; 379/389; 307/254
[58] Field of Search ............... 307/254, 240, 244, 549, 307/567; 379/413, 399, 390, 389, 388, 387, 406, 409; 323/317

[56] References Cited

U.S. PATENT DOCUMENTS

| | | | |
|---|---|---|---|
| 4,331,886 | 5/1982 | Perner et al. | 307/270 |
| 4,492,824 | 1/1985 | Bell et al. | 379/389 |
| 4,584,520 | 4/1986 | Vinn | 323/316 |
| 4,712,233 | 12/1987 | Kuo | 379/386 |
| 4,827,153 | 5/1989 | Schwarz et al. | 307/80 |

Primary Examiner—Jin F. Ng
Assistant Examiner—Magdy Shehata
Attorney, Agent, or Firm—Michael D. Bingham

[57] ABSTRACT

A current switch that is responsive to logic switching control signals is used in a telephone circuit comprising a handset receive signal path and a speakerphone receive signal path for separation a received voice signal into either the handset or speakerphone receive path depending on the selected mode of operation of the telephone circuit. The current switch includes a pair of switched current mirrors and clamp circuits which are rendered active or inactive depending on the particular mode of operation. The clamp circuits maintain the dc voltage appearing at the input of each current mirror constant as the particular current mirror is switched between active and inactive states thereby inhibiting audible dc transients.

9 Claims, 2 Drawing Sheets

CURRENT SWITCH FOR USE IN TELEPHONY SYSTEMS OR THE LIKE

BACKGROUND OF THE INVENTION

The present invention relates to current switches and, more particularly, to a current switch for separating analog voice signals in a telephony system such as a combined speakerphone/handset integrated circuit providing switched speech communication.

Full phone systems combining speakerphone and handsets are well known. Typically, in these systems the default mode of operation is the handset receiver path. Hence, whenever the handset is lifted off-hook the speakerphone portion of the system is muted. However, in response to selecting the hands free speakerphone mode of operation the handset portion of the system must be automatically muted.

In order to successfully integrate the functions of a voice-switched speakerphone and a telephone handset network onto a single chip, it is necessary to be able to switch voice and dialing signals to the proper circuitry. Thus, depending on the mode of operation, the voice signal is heard at the speakerphone speaker or handset receiver only. Hence, a need exist for providing electronic switching of the voice signals between the speakerphone and handset circuitry depending on the proper mode of operation. Moreover, it is desirable to switch only alternating currents while maintaining direct current voltages in the signal paths constant to keep audible transients from being generated when the circuit is switched between modes.

SUMMARY OF THE INVENTION

Accordingly, it is an object of the present invention to provide an improved current switch for separation of analog alternating current signals.

It is another object of the present invention to provide switching of a voice signal between two current paths in a combine handset/speakerphone system depending on whether the handset or speakerphone mode of operation is selected.

In accordance with the above and other objects there is provided a current switch for separating an applied ac input signal and reproducing the same at first and second outputs responsive to logic control signals wherein the current switch includes first and second switchable current mirrors each having an input coupled to the input of the current switch and an output coupled respectively to the first and second outputs and a common terminal. First and second switching means are respectively coupled to the common terminals of the current mirrors and are responsive to selective ones of the logic control signals for either rendering the respective current mirror operative or non-operative accordingly.

DETAILED DESCRIPTION OF THE PREFERRED EMBODIMENT

Figure 1:
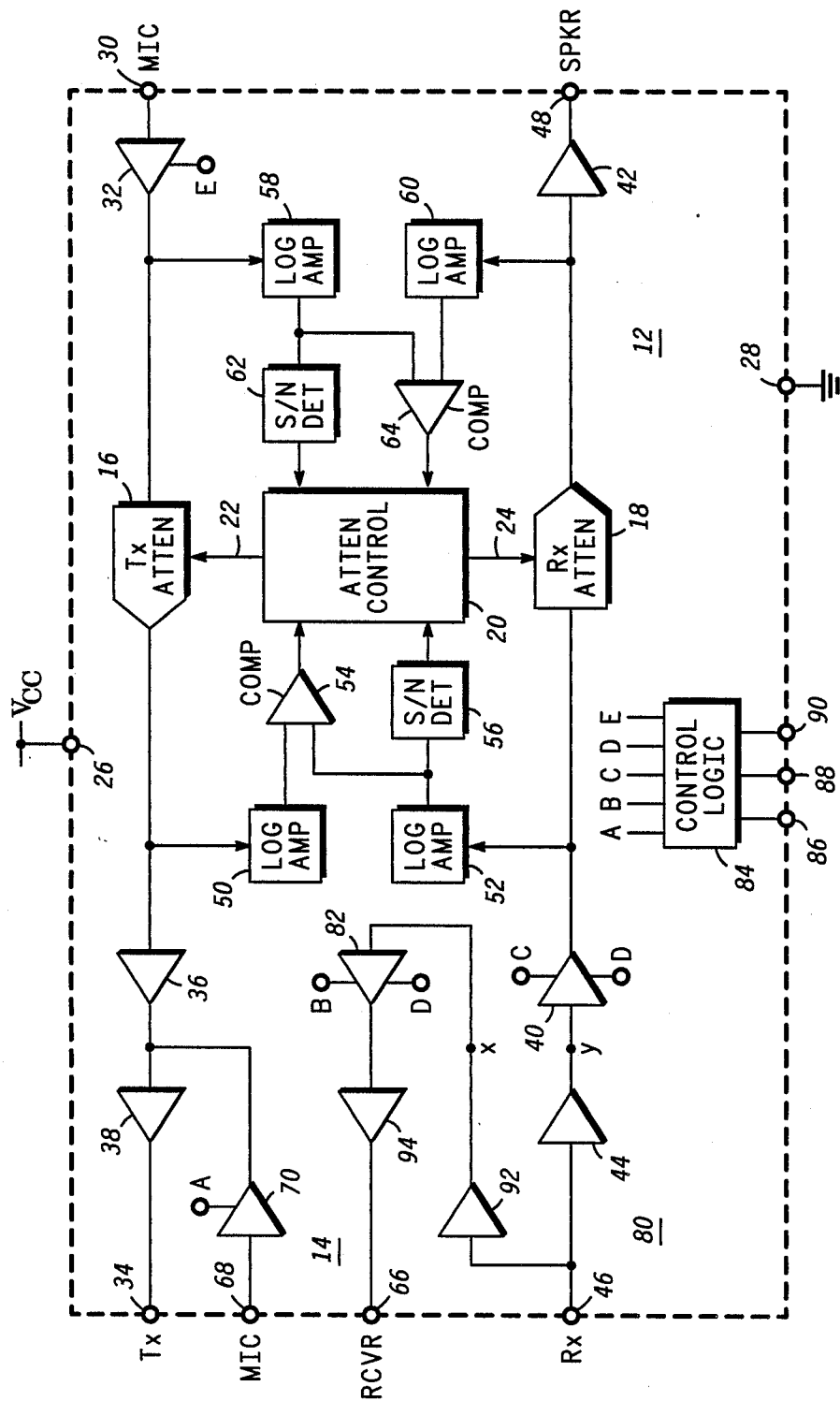
FIG. 1 is a block diagram of a speakerphone/handset system including the current switch of the present invention.

Turning now to FIG. 1 there is illustrated integrated circuit 10 which includes a voice switched speakerphone circuit 12 and handset or telephone speech network 14. Speakerphone circuit portion 12 as illustrated is well known and is described in U.S. Pat. No. 4,724,540. Briefly, speakerphone 12 is voice-switched between a transmit(Tx) and receive(Rx) mode of operation. The operation of the speakerphone is accomplished by controlling the gain/attenuation of attenuators 16 and 18 in a complementary manner by supplying dc control signals thereto from attenuator control circuit 20 via leads 22 and 24. Power supply voltage is supplied to circuit 10 via inputs 26 and 28. The transmit signal path including transmit attenuator 16 is coupled to input terminal 30 through controlled amplifier 32. A speakerphone microphone(mic) which is not shown would be connected to input 30. The output of attenuator 16 is coupled to output terminal 34 through amplifiers 36 and 38. The voice current receive current path of speakerphone 12 includes Rx attenuator 18 coupled in series between the output of amplifier 40 and the input of amplifier 42. Amplifier 40 is coupled via amplifier 44 to the receive input terminal 46 while the output of amplifier 42 is coupled to output 48. Output 48 is intended to be coupled to the speakerphone speaker (not shown) while terminals 34 and 46 would be coupled to the telephone lines via appropriate circuitry.

Four point sensing is provided at the respective input and outputs of attenuators 16 and 18 for providing logic input signals to attenuator control circuit 20 for varying the gain of the attenuators accordingly. Hence, the output of attenuator 16 as well as the output of amplifier 40 are coupled to logarithmic amplifiers 50 and 52 respectively the outputs of which are coupled to the inputs of comparator 54. The output of comparator 54 supplies one input to control circuit 20 while the output of logarithmic amplifier 52 is coupled to signal to noise detector 56 with the output of the latter being supplied to a second input of control circuit 20. Similarly, the output of attenuator 18 and amplifier 32 are coupled through logarithmic amplifiers 58 and 60 and signal to noise detector 62 and comparator 64 to additional inputs of control circuit 20.

Since the operation of speakerphone circuit 12 is well known it will only be briefly described hereinafter. If a near-end speaker is talking into the speakerphone microphone while the far-end talker is listening, speakerphone 10 is placed in a transmit mode and the gain of attenuator 16 is maximized while the attenuation of attenuator 18 is maximized by control circuit 20 sensing the mode of operation and providing the appropriate dc control voltages to the respective attenuators. Similarly, if the far-end speaker is talking a voice current receive signal is received at trerminal 46. Suffice it to say at this time that in the speakerphone mode of operation amplifier is rendered operative whereby the received signal is coupled through atttenuator 18 and amplifier 42 and to the speakerphone speaker coupled to terminal 48. In this receive mode the gain of attenuator 18 and the attenuation of attenuator 16 are maximized by the dc voltages supplied thereto from control circuit 20.

If the telephone handset is lifted off hook circuit 10 defaults to the handset receive mode wherein the voice receive signal is coupled to the handset receiver speaker at terminal 66 while the handset voice transmit current signal applied through the handset microphone to terminal 68 is coupled to terminal 34 via controlled amplifiers 70 and 38.

The present invention comprises current switch including controlled amplifiers 40 and 82 which allows for either the speakerphone or handset channels to be completely active or both channels to be inactive. The latter mode is required for dialing purposes. Amplifiers 40 and 82 are responsive to logic control signals generated by control logic circuit 84 in response to externally applied input signals supplied at inputs 86, 88 and 90. In operation, during the handset mode of operation outputs A and B are at a logic "1" while outputs C, D and E are logic "0". Hence, amplifier 40 and 32 are rendered inoperative while amplifiers 70 and 82 are rendered operative or active. The received voice current signal is therefore coupled via amplifier 92, controlled amplifier 82 and amplifier 94 to the handset receiver while the voice transmit current signal is coupled to transmit terminal 34 via amplifier 38. Now, if the circuit 10 is placed in the speakerphone mode of operation, by for example input 86 receiving a logic "1" input signal, amplifier 40 will be active or rendered operative while amplifier 82 is inactivated. Hence, in the speakerphone mode of operation outputs A, B and D are logic "0" while C and E are logic "1". Thus, any voice transmit signal is coupled through attenuator 16 to Tx terminal 34 while voice receive current signal is coupled through amplifier 40, attenuator 18 and amplifier 42 to the speakerphone speaker.

During dialing, output D is a logic "1" while outputs A, B, C and E are logic "0". This will keep both paths inactive or non-operative and the dc voltage at the inputs of switches 40 and 82 constant. Therefore, when an external dialing signal is inputted at the amplifier 94 or amplifier 42, depending on the mode of operation of circuit 10, any voice signals which may be present will not cause the dialing signal to be distorted. After dialing circuit 10 will revert to one of the voice modes and, if the dc voltage at the input of the switch is held constant, no audible transient will occur.

Figure 2:
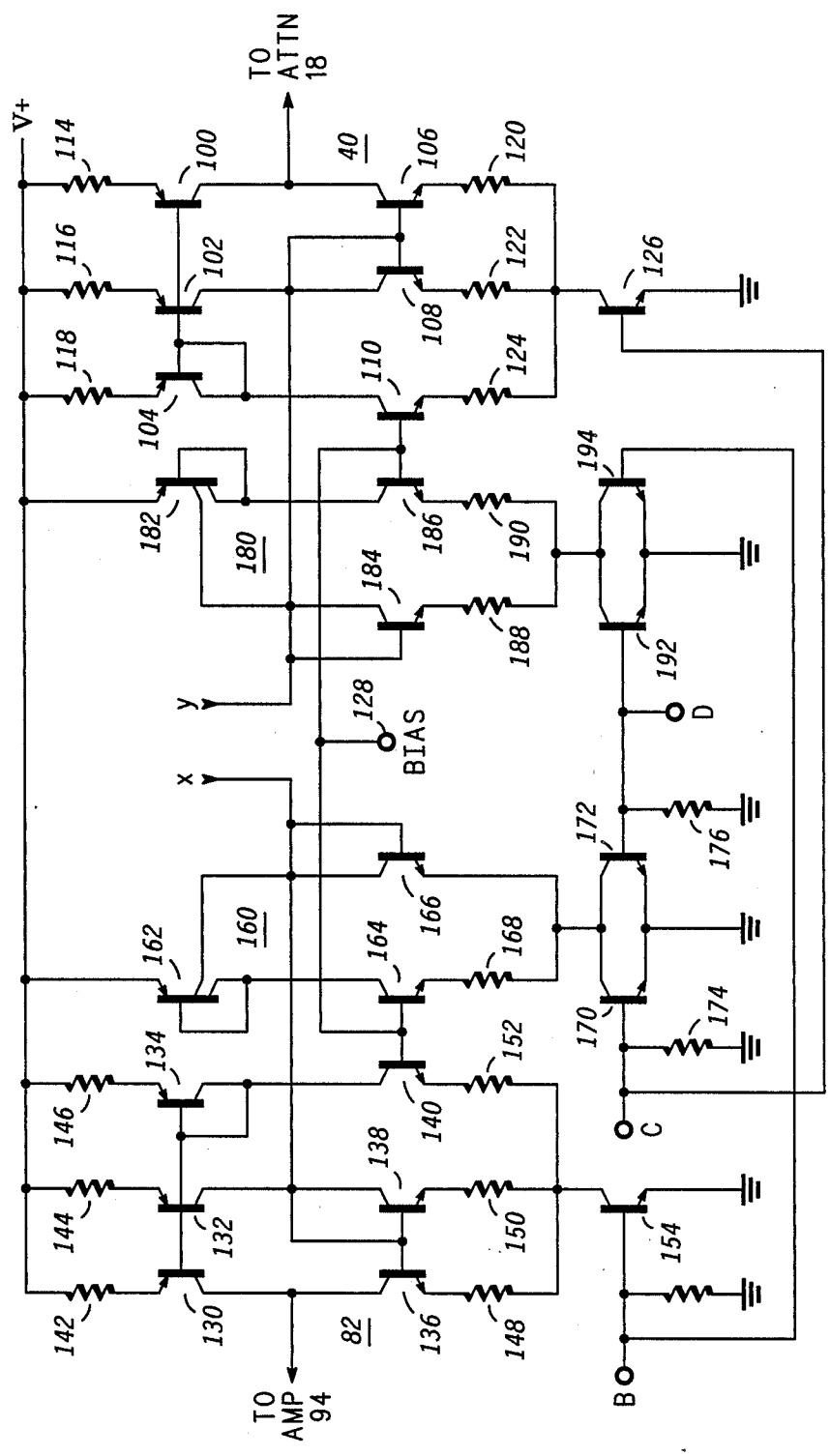
FIG. 2 is schematic diagram to the embodiment of the present invention.

Referring to FIG. 2, amplifiers 40 and 82 are illustrated as being realized by a pair of controlled current mirrors and include a pair of dc voltage clamps that keep the dc voltage constant as switch 80 is inactive. Amplifier or switch 40 is shown as including PNP current sourcing transistors 100, 102 and 104 the collectors of which are respectively coupled to the collectors of current sinking NPN transistors 106, 108 and 110. The emitters of the current sourcing transistors are coupled to power supply conductor 112 via respective resistors 114, 116, and 118 while the bases are interconnected. The emitters of the current sinking transistors are coupled via respective resistors 120, 122 and 124 to the collector of switching transistor 126 while the base and emitter of the latter is coupled to output C of logic control circuit 84 and ground respectively. Transistors 104 and 108 are connected as diodes by having their base connected to the collector. Amplifier 40 receives the voice receive current signal at node y which is coupled to the interconnected bases of transistors 106 and 108 while the output of the amplifier is coupled to receive attenuator 18. The base of transistor 110 is coupled to a dc bias signal at terminal 128. Both the structure and operation of amplifier 82 is substantially same as described for amplifier 40 and hence will not be explained in greater detail. As illustrated, amplifier 82 includes current sourcing PNP transistors 130, 132 and 134 coupled to current sinking NPN transistors 136, 138 and 140 and associated resistors 142, 144, 146, 148, 150 and 152. The collector of switching transistor 154 is coupled to the emitters of transistors 136, 138 and 140 via the respective resistors and has its base coupled to output B of control logic circuit 84 while its emitter is coupled to ground potential. The input of amplifier 82 is coupled to node x at the interconnected bases of transistors 136 and 138 while the output is taken at the collector of transistor 136 and coupled to the input of amplifier 94.

In operation, if circuit 10 is in the speakerphone mode, the base of transistor 126 will be at a logic one while the base of transistor 154 will be at a logic "0". Hence, amplifier or switch 40 is active as transistor 126 is biased on and amplifier or switch 82 is inactive or non-operative since transistor 154 is turned off. Assuming for descriptive purposes that all transistors are matched, the current flowing through transistor 110 is mirrored through the upper PNP transistors which source equal current to transistors 106 and 108. Hence, with no receive voice current signal supplied at node y, there is no output current at the output of the amplifier as transistor 106 sinks all of the current sourced from transistor 100. Transistor 106 is modulated by the receive voice current supplied to the base thereof to produce a current output signal at the collector thereof which is representative of the voice signal. Thus, as the voice current signal increases, transistor 106 conducts harder to cause the output to decrease. Similarly, as the voice signal decreases, transistor 106 conducts less which causes the output to increase. The receive voice current signal is thus reproduced at the collector of transistor 106, the output of the amplifier. Likewise, as amplifier 82 is rendered active by transistor 154 being turned on, the receive voice current signal appearing at node x is reproduced at the collector of transistor 136.

Current switch 80 also includes a pair of substantially identical clamp circuits 160 and 180 which, as will be explained, maintain the dc voltage at the inputs of switches 40 and 82 constant as the switches are inactive. Clamp 160 comprises PNP current source transistor 162 which supplies first and second currents at first and second collector to the collectors of transistors 164 and 166 respectively. The emitter of NPN transistor 164 and 166 are illustrated as being coupled via resistor 168 and directly coupled respectively to the interconnected collectors of NPN transistors 170 and 172. For matching, the emitter of transistor 166 could also be coupled through a resistor to the collectors of the latter transistors. The base of transistor 164 is both coupled to the base of transistor 140 and terminal 128 to which is supplied the aforementioned dc bias signal while the base of transistor 166, which is connected as a diode, is returned to node x to which the handset reveive voice current signal is applied. The bases of transistors 170 and 172 are biased by the logic control signals C and D developed across resistors 174 and 176 respectively while their emitters are returned to ground potential. Similarly, clamp 180 includes current source transistor 182 which supplies currents to the collectors of transistors 184 and 186 the emitters of the latter being coupled via respective resistors 188 and 190 to the interconnected collectors of transistor 192 and 194. The base of transistor 192 is coupled to the D output of control logic circuit 84 while the base of transistor 194 is coupled to the B output of the latter. The emitters of transistors 192 and 194 are returned to ground potential. Diode connected transistor 184 has its base-collector coupled to node y while the base of transistor 186 is biased at terminal 128.

As the operation of clamp 160 and 180 are identical, only the operation of clamp 180 is necessary. In the handset voice mode, the B signal is a logic "1" while C and D are a logic "0". The collectors of transistors 154 and 194 pull within several millivolts of ground thus activating switch 82 and clamp 180 while switch 40 and clamp 160 are rendered inactive. Therefore, as previously mentioned, the handset receiver path is active while the speakerphone receiver path is inactive and the receive voice signal will be heard only at the handset receiver. Since transistor 194 is turned on, transistors 184 and 186 are also turned on. This forces the dc voltage developed at the base-collector of diode connected transistor 184 to be at the substantially same dc voltage as the base-collector of diode connected transistor 108. Therefore, this inhibits any dc audible transients from being developed at the base of transistor 106 as switch 40 is activated in the speakerphone voice mode of operation after having been inactivated during the handset voice mode. Likewise, in the speakerphone mode of operation, B and D are a logic "0" while C is a logic "1". Hence, transistors 126 and 170 are turned on activating switch 40 and clamp 160 while switch 82 and clamp 180 are inactive and the compliment of the above occurs and the receive voice signal is heard at the speakerphone speaker only. Thus, as the dc voltage at the inputs of the switches are held constant by the corresponding clamp circuits, no audible transients will occur. Further, it should be noted that only ac current is transmitted through the respective switches 40 and 82. The dc currents in the respective PNP and NPN transistors cancel each other thus allowing for dc coupling between stages.

During dialing operation, both B and C are a logic "0" while D is a logic "1". Similarly, A and E are at the correct logic level to render amplifiers 32 and 70 inactive. Hence, clamps 160 and 180 are both active while current mirrors 40 and 82 inactive and the inputs x and y are clamped to the same potential as when the current mirrors 40 and 82 are active. Thus, when circuit 10 reverts back to the voice mode, after dialing has been accomplished, there is no audible dc transient at the outputs of either one of the current mirrors.

Hence, what has been described above is a novel current switch arrangement for use in handset/speakerphone circuitry for separating the receive voice ac current signal into the handset receiver and speakerphone receiver paths depending on the selected mode of operation. The novel current switch arrangement allows for isolation and switching of speakerphone and handset voice and dialing signals while inhibiting dc audible transients as the switches are switched between active and inactive states thereby switching only ac currents.

What is claimed is:

1. A current switch for supplying an alternating current (ac) signal received at an input to either a first or second output thereof responsive to the level state of a plurality of switching control signals applied to the current switch, the current switch comprising:
    a first switchable current mirror having an input, and output and a common terminal, said input being coupled to the input of the current switch and said output being coupled to the first output of the current switch;
    a second switchable current mirror having an input, an output and a common terminal, said input being coupled to the input of the current switch and said output being coupled to the second output of the current switch;
    first and second switching means coupled respectively to said common terminals of said first and second switchable current mirrors and receiving first and second ones of the plurality of switching control signals;
    said first switchable current mirror being rendered operative in response to said first switching control signal supplied thereto being in a first level state and being rendered non-operative when said first switching control is in a second level state;
    said second switchable current mirror being rendered operative in response to said second switching control signal supplied thereto being in a first level state and being rendered non-operative when said second switching control is in a second level state;
    first clamp means coupled to said input of said second switchable current mirror and being responsive both to said first switching control signal being in said first level state and a third switching control signal for maintaining the direct current voltage level at said input of said second switchable current mirror while the latter is non-operative substantially the same as when the latter is operative; and
    second clamp means coupled to said input of said first switchable current mirror and being responsive both to said second switching control signal being in said first level state and said third switching control signal for maintaining the direct current voltage level at said input of said first switchable current mirror while the latter is non-operative substantially the same as when the latter is operative.

2. The current switch of claim 1 wherein said first clamp means includes:
    first current supply means for supplying first and second output currents at respective first and second outputs;
    first and second transistors each having a base, collector and an emitter, said collectors being interconnected, said emitters being coupled to a first power supply conductor at which is supplied a first voltage, said base of said first transistor receiving said first switching control signal and said base of said second transistor receiving said third switching control signal;
    a third transistor having its collector-emitter conduction path coupled between said first output of said first current supply and said interconnected collectors of said first and second transistors, the base thereof being coupled to a terminal at which a bias signal is supplied; and
    first diode means coupled between said second output of said first current supply means and said interconnected collectors of said first and second transistors and said second output of said first current supply means being coupled to said input of said second switchable current mirror.

3. The current switch of claim 2 wherein said second clamp means includes:
    a second current supply means for supplying third and fourth output currents at respective first and second outputs;
    fourth and fifth transistors each having a base, collector and an emitter, said collectors being interconnected, said emitters being coupled to said first power supply conductor, said base of said fourth transistor receiving said second switching control signal and said base of said fifth transistor receiving said third switching control signal;

a sixth transistor having its collector-emitter conduction path coupled between said first output of said second current supply means and said interconnected collectors of said fourth and fifth transistors, the base thereof being coupled to said terminal at which said bias signal is supplied; and second diode means coupled between said second output of said second current supply means and said interconnected collectors of said fourth and fifth transistors and said second output of said second current supply means being coupled to said input of said first switchable current mirror.

4. The current switch of claim 3 wherein:

said first switching means is a seventh transistor the collector-emitter conduction path of which is coupled between said common terminal of said first switchable current mirror and said first power supply conductor and the base being coupled to a terminal to which said first switching control signal is supplied; and said second switching means is a eighth transistor the collector-emitter conduction path of which is coupled between said common terminal of said second switchable current mirror and said first power supply conductor and the base being coupled to a terminal to which said second switching control signal is supplied.

5. In an integrated telephone circuit which includes a handset receive path and a speakerphone receive path in which the circuit is switchable between operating modes wherein a received voice current signal is either supplied to a handset receiver through the handset receive path or a speakerphone speaker, the improvement comprising a current switch for separating the alternating current (ac) voice current signal into the handset or speakerphone receive paths as the circuit is switched between operating modes responsive to a plurality of switching control signals, said current switch including a first switchable current mirror having an input, output and common terminal, said input being coupled to the input of the current switch and said output being coupled to the first output of the current switch; a second switchable current mirror having an input, output and a common terminal, said input being coupled to the input of the current switch and said output being coupled to the second output of current switch; first and second switching means coupled respectively to said common terminal of said first and second switchable current mirrors and receiving first and second ones of the plurality of switching control signals; said first switchable current mirror being rendered operative in response to said first switching control signal suppled there to being in a first level state and being rendered non-operative when said first switching control signal is in a second level state; and said second switchable current mirror being rendered operative in response to said second switching control signal supplied thereto being in a first level state and being rendered non-operative when said second switching control signal is in a second level state.

6. The current switch of claim 5 including:

first clamp means coupled to said input of said second switchable current mirror and being responsive both to said first switching control signal being in said first level state and a third switching control signal for maintaining the direct current voltage level at said input of said second switchable current mirror while the latter is non-operative substantially the same as when the latter is operative; and second clamp means coupled to said input of said first switchable current mirror and being responsive both to said second switching control signal being in said first level state and said third switching control signal for maintaining the direct current voltage level at said input of said first switchable current mirror while the latter is non-operative substantially the same as when the latter is operative.

7. The current switch of claim 6 wherein said first clamp means includes:

first current supply means for supplying first and second output currents at respective first and second outputs;

first and second transistors each having a base, collector and an emitter, said collectors being interconnected, said emitters being coupled to a first power supply conductor at which is supplied a first voltage, said base of said first transistor revieving said first switching control signal and said base of said second transistor receiving said third switching control signal;

a third transistor having its collector-emitter conduction path coupled between said first output of said first current supply and said interconnected collectors of said first and second transistors, the base thereof being coupled to a terminal at which a bias signal is supplied; and first diode means coupled between said second output of said first current supply means and said interconnected collectors of said first and second transistors and said second output of said first current supply means being coupled to said input of said second switchable current mirror.

8. The current switch of claim 7 wherein said second clamp means includes:

a second current supply means for supplying third and fourth output currents at respective first and second outputs;

fourth and fifth transistors each having a base, collector and an emitter, said collectors being interconnected, said emitters being coupled to said first power supply conductor, said base of said fourth transistor receiving said second switching control signal and said base of said fifth transistor receiving said third switching control signal;

a sixth transistor having its collector-emitter conduction path coupled between said first output of said second current supply means and said interconnected collectors of said fourth and fifth transistors, the base thereof being coupled to said terminal at which said bias signal is supplied; and second diode means coupled between said second output of said second current supply means and said interconnected collectors of said fourth and fifth transistors and said second output of said second current supply means being coupled to said input of said first switchable current mirror.

9. The current switch of claim 8 wherein:

said first switching means is a seventh transistor the collector-emitter conduction path of which is coupled between said common terminal of said first switchable current mirror and said first power supply conductor and the base being coupled to a terminal to which said first switching control signal is supplied; and said second switching means is a eighth transistor the collector-emitter conduction path of which is coupled between said common terminal of said second switchable current mirror and said first power supply conductor and the base being coupled to a terminal to which said second switching control signal is supplied.

* * * * *